(12) United States Patent
Oikawa

(10) Patent No.: US 8,373,263 B2
(45) Date of Patent: Feb. 12, 2013

(54) INTERCONNECTION STRUCTURE AND ITS DESIGN METHOD

(75) Inventor: Ryuichi Oikawa, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 205 days.

(21) Appl. No.: 13/015,045

(22) Filed: Jan. 27, 2011

(65) Prior Publication Data
US 2011/0180940 A1    Jul. 28, 2011

(30) Foreign Application Priority Data

Jan. 28, 2010   (JP) ................................ 2010-016576

(51) Int. Cl.
*H01L 23/52*    (2006.01)
(52) U.S. Cl. ....................................... 257/691; 257/678
(58) Field of Classification Search .................. 257/678, 257/691
See application file for complete search history.

(56) References Cited

U.S. PATENT DOCUMENTS

| | | | |
|---|---|---|---|
| 6,538,336 B1 | 3/2003 | Secker et al. | |
| 2010/0007005 A1* | 1/2010 | Akimoto et al. | ............ 257/691 |

OTHER PUBLICATIONS

Myoung Joon Choi, et al., "Controllable Parameters Identification for High Speed Channel through Signal-Power Integrity Combined Analysis", Electronic Components and Technology Conference, 2008, pp. 658-663.
Ryuichi Oikawa, "A Low-cost Wire-bonding Package Design with Package Built-in Three-Dimensional Distributed Matching Circuit for over 5Gbps SerDes Applications", Electronic Components and Technology Conference, 2009, pp. 1098-1105.

* cited by examiner

*Primary Examiner* — Bradley K Smith
(74) *Attorney, Agent, or Firm* — Sughrue Mion, PLLC

(57) ABSTRACT

An interconnection structure includes a semiconductor chip, a mounting substrate on which the semiconductor chip is mounted, and a group of bonding wires provided to connect the semiconductor chip and the mounting substrate. The group of bonding wires includes: a first signal bonding wire contained in a first envelope and provided to propagate a signal; a first power supply bonding wire contained in the first envelope and applied with a first power supply voltage; and a second power supply bonding wire contained in a second envelope and applied with a second power supply voltage. One of the first envelope and the second envelope is arranged between the other of the first envelope and the second envelope and the mounting substrate. The second power supply bonding wire is arranged in a position in which electromagnetic coupling between the second power supply bonding wire and the first signal bonding wire is smaller than electromagnetic coupling between the second power supply bonding wire and the first power supply bonding wire.

9 Claims, 13 Drawing Sheets

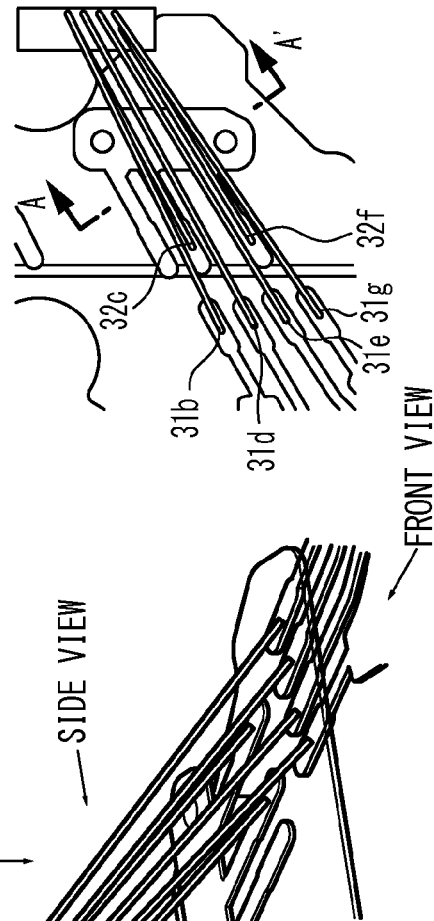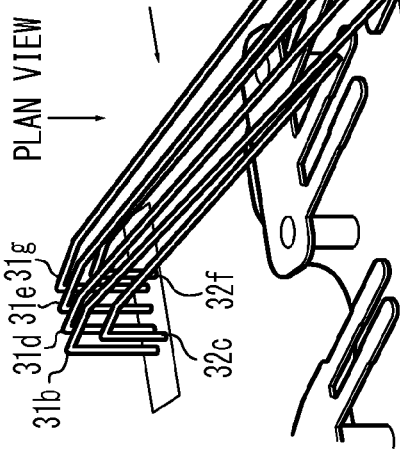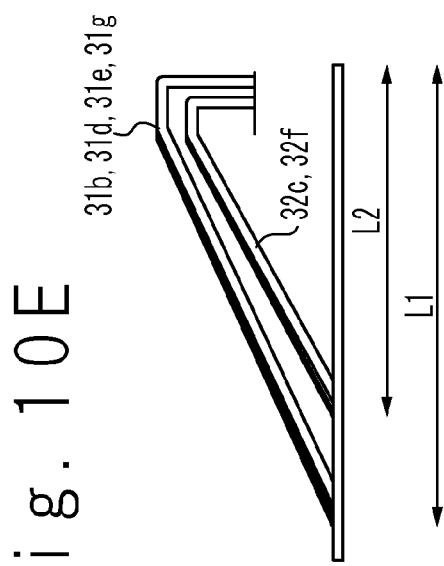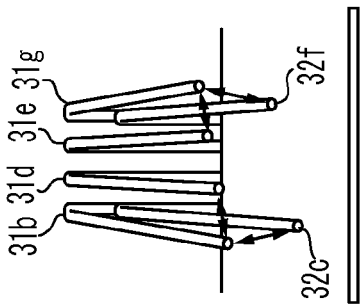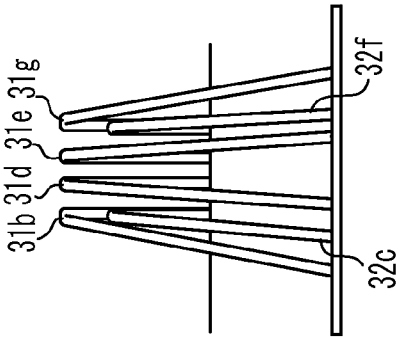

INTERCONNECTION STRUCTURE AND ITS DESIGN METHOD

INCORPORATION BY REFERENCE

This patent application claims a priority on convention based on Japanese Patent Application No. 2010-16576 filed on Jan. 28, 2010. The disclosure thereof is incorporated herein by reference.

TECHNICAL FIELD

The present invention is related to an interconnection structure and a design method of the interconnection structure, and more particularly, to an interconnection structure including bonding wires in a semiconductor device and a design method of the interconnection structure.

BACKGROUND ART

In recent years, high speed semiconductor devices have been causing problems such as power supply noise, signal reflection, inter-signal interference (crosstalk) and EMI (Electromagnetic Interference). Conventionally, a power supply system and a signal system were independently discussed, analyzed and designed, such as power supply noise and EMI, degradation of signal quality due to signal reflection and skew which also causing EMI, degradation of a signal waveform due to inter-signal interference and/or EMI, so on.

However, in these several years, as a signal density and a signal transmission rate increase, direct interaction between signals and power supplies has been pointed out, which occurs during signal transmission inside the semiconductor device packages or printed circuit boards. Such a problem is described in Non-Patent Literature 1 and Non-Patent Literature 2.

Here, direct common mode noise transition from a power supply line to a signal line, or oppositely, direct noise transfer from a signal line to a power supply line during signal transmission due to a propagating signal and so on are causing new problems. These direct signal-power interactions cause EMI which results in an operation instability to the Gbps-clalss high-speed devices by generating a positive feed back loop between signal and power delivery systems.

Generally, it is proposed to provide a ground shield in order to prevent inter-signal interference, including noise. However, in a case that a part of signal line is a bonding wire, it is difficult to provide a ground shield surrounding each of all the bonding wires in the semiconductor device. Not only difficulty in manufacture such a semiconductor device, the semiconductor device becomes large in size, thus, the manufacturing cost increases. Therefore, it is preferable to achieve electrical performance without need for a special high-cost manufacturing process.

FIGS. 1A and 1B compare the output signal spectra from exactly the same LSIs mounted on the two different types of interposer. FIG. 1A is a graph showing a case where an interposer has bonding wires. FIG. 1B is a graph showing a case where an interposer is of a flip-chip type. In the flip-chip type interposer, a power supply line and a signal line are provided in different layers and are shielded from each other by a ground plane.

These two LSIs operate in the signal rate of 6.4 Gbps. These output signal spectra were obtained by performing Fourier transformation on the observed common mode signal waveforms. In these graphs, the horizontal axis shows frequency and the vertical axis shows intensity of noise. The solid line indicates a case where only a signal was inputted to the interposer with no power supply noise, and the broken line indicates a case where the signal was inputted to the interposer with power supply noise.

The following facts are observed from FIGS. 1A and 1B. That is, in a case of the flip-chip type interposer, because the signal and the power supply are well shielded, the common mode noise spectrum is well coincident regardless of existence or non-existence of the power supply noise. On the other hand, in a case of the interposer which contains bonding wires, the difference of the common mode noise between the existence and non-existence of the power supply noise is very large, especially in a mega-hertz region. The reason for this large difference in the mega-hertz region is that a main frequency component of the power supply noise is in the mega-hertz region in this example. The flip-chip type interposer is more expensive than the interposer having bonding wires.

As shown in the above example, direct noise transition from the power supply system to the signal system in the interposer is large when the semiconductor device has bonding wires therein, thus some measure is necessary which reduces the noise transition or interference. That is, for the next generation low-cost and high-speed devices, a new scheme is required that reduces interference and coupling between the power supply and the signal as well as reducing power supply noise itself. In addition, as suggested by the various publications, for stable operations of the giga-bps-class high-speed devices, it is also necessary to reduce inter-signal interference (crosstalk) and signal reflection caused by impedance discontinuity. Because the layout resource on the interposer is limited especially for the low-cost interposer, it is ideal to satisfy all the requirements with optimum balance.

FIGS. 2A to 2C show an example of the arrangement of bonding wires which connect an LSI chip to an interposer substrate, described in Patent Literature 1 (U.S. Pat. No. 6,538,336). FIG. 2A is a perspective view showing the arrangement of the bonding wires. FIG. 2B is a side view showing the arrangement of the bonding wires. FIG. 2C is a sectional view of the bonding wires along the line A-A' in FIG. 2B.

As seen from FIGS. 2A and 2B, the LSI chip is mounted on the interposer substrate in this example. Bonding pads are arranged in two lines in each of the surface of the LSI chip and the surface of the interposer substrate. The bonding wire is connected from the bonding pad on the LSI chip to the bonding pad on the interposer substrate.

The symbols of "S", "G" and "P" shown in FIG. 2C mean that the bonding wires are for a signal, ground and power supply, respectively. As seen in FIG. 2C, the ground bonding wire or the power supply bonding wire is arranged in adjacent to the signal bonding wire. Here, a pre-determined voltage may be applied to the ground bonding wire and the power supply bonding wire in which the pre-determined voltage may be replaced with a very low frequency signal compared to that of the signal bonding wire. From this point, the bonding wires for ground, power supply and the extremely low frequency signal are, in short, referred as fixed voltage bonding wires.

As seen from FIG. 2B, the bonding wire connected with one of the bonding pads of a second one of two lines which is arranged on the LSI chip on the side near the mounting substrate, is provided lower than a bonding wire connected with one of the bonding pads of a first line as the other line. In other words, the bonding wires connected with the first line of bonding pads are contained in a first envelope, and the bonding wires connected with the second line of bonding pads are contained in a second envelope, which is located below the first envelope.

In this way, in the example of FIGS. 2A to 2C, the high-speed signal bonding wires and the fixed voltage bonding wires are alternately arranged in two lines. In this case, the high-speed signal bonding wires are shielded by the fixed voltage bonding wire. As a result, crosstalk between the high-speed signals is restrained.

To arrange the bonding wires as mentioned above, basically, it is necessary to arrange the high-speed signal bonding pad and the power supply bonding pad or the ground bonding pad alternately in line on the LSI chip or the interposer substrate.

FIG. 3 is a plan view showing another example of the arrangement of bonding wires which connect the LSI chip and the interposer substrate, as shown in the Patent Literature 1. In the example of FIG. 3, bonding pads on the LSI chip are arranged in two lines in which one is shifted from another.

The crosstalk between the high-speed signal bonding wires can be reduced by using the bonding pads arranged in two lines and handling the high-speed signal, and the power supply, the ground and/or an extremely low frequency signal in the same manner. According to this technique, although the number of bonding pads for an I/O circuit tend to increase, a sufficiently good crosstalk restraint effect is attained depending on the ratio of the high-speed signal bonding pads and the fixed voltage bonding pad.

CITATION LIST

[Patent Literature 1]: U.S. Pat. No. 6,538,336
[Non-Patent Literature 1]: "Controllable Parameters Identification for High Speed Channel through Signal-Power Integrity Combined Analysis" (Proceedings of 58th Electronic Components and Technology Conference, 658 (2008)) by Myoung Joon Choi, Vishram S. Pandit, and Woong Hwan Ryu
[Non-Patent Literature 2]: "A Low-cost Wire-bonding Package Design with Package Built-in Three-dimensional Distributed Matching Circuit for over 5 Gbps SerDes Applications" (Proceedings of 59th Electronic Components and Technology Conference, 1098 (2009)) by Ryuichi Oikawa

SUMMARY OF THE INVENTION

In the Patent Literature 1, all the requirements for the next-generation low-cost and high-speed devices are not satisfied in a good balance. The above requirements are such as:
(a) restraint of interference and coupling between a power supply and a signal (restraint of propagation of common mode noise);
(b) restraint of power supply noise;
(c) restraint of interference and crosstalk between signals; and
(d) restraint of signal reflection due to impedance discontinuity.

It is apparent from the subject matter that the requirement (c) is satisfied in the Patent Literature 1. As understood from the arrangement of FIG. 3 although not especially described in the Patent Literature 1, the effective impedance is reduced due to mutual inductance because the power supply bonding wire and the ground bonding wire are adjacent to each other. As a result, the restraint effect to the power supply noise functions. However, in the cases of FIGS. 2A to 2C in the Patent Literature 1, the same effect cannot be attained.

Next, as for the requirement (d), in Patent Literature 1, evidently, the power supply bonding wire or the ground bonding wire functioning as a return path for the high-speed signal is arranged in the neighborhood of the signal bonding wire. However, the bonding pad on the interposer is not arranged on the same line as the pad for the high-speed signal. Therefore, it is not possible to reduce the high impedance of the bonding wire sufficiently low. Thus, in this point, it is rather disadvantageous in the continuity of the impedance.

Lastly, the requirement (a) has not been considered conventionally. The requirement (a) is not satisfied if the power supply and the ground are equivalently handled, like the Patent Literature 1. The Patent Literature 1 does not show a solution.

In an aspect of the present invention, an interconnection structure includes a semiconductor chip, a mounting substrate on which the semiconductor chip is mounted, and a group of bonding wires provided to connect the semiconductor chip and the mounting substrate. The group of bonding wires includes: a first signal bonding wire contained in a first envelope and provided to propagate a signal; a first power supply bonding wire contained in the first envelope and applied with a first power supply voltage; and a second power supply bonding wire contained in a second envelope and applied with a second power supply voltage. One of the first envelope and the second envelope is arranged between the other of the first envelope and the second envelope and the mounting substrate. The second power supply bonding wire is arranged in a position in which electromagnetic coupling between the second power supply bonding wire and the first signal bonding wire is smaller than electromagnetic coupling between the second power supply bonding wire and the first power supply bonding wire.

In another aspect of the present invention, a semiconductor device includes an interconnection structure which comprises a semiconductor chip, a mounting substrate on which the semiconductor chip is mounted, and a group of bonding wires provided to connect the semiconductor chip and the mounting substrate. The group of bonding wires includes: a first signal bonding wire contained in a first envelope and provided to propagate a signal; a first power supply bonding wire contained in the first envelope and applied with a first power supply voltage; and a second power supply bonding wire contained in a second envelope and applied with a second power supply voltage. One of the first envelope and the second envelope is arranged between the other of the first envelope and the second envelope and the mounting substrate. The second power supply bonding wire is arranged in a position in which electromagnetic coupling between the second power supply bonding wire and the first signal bonding wire is smaller than electromagnetic coupling between the second power supply bonding wire and the first power supply bonding wire.

In still another aspect of the present invention, a design method of an interconnection structure is provided which includes a semiconductor chip, a mounting substrate on which the semiconductor chip is mounted, and a group of bonding wires provided to connect the semiconductor chip and the mounting substrate. The group of bonding wires includes: a first signal bonding wire contained in a first envelope and provided to propagate a signal; a first power supply bonding wire contained in the first envelope and applied with a first power supply voltage; and a second power supply bonding wire contained in a second envelope and applied with a second power supply voltage. The design method is achieved by setting an initial value of a length of each of the first signal bonding wire, the first power supply bonding wire and the second power supply bonding wire; by generating a circuit model by using electromagnetic field analysis based on the set values; by calculating common mode noise by performing circuit simulation based on the circuit model; by changing the set value for the length of the second power supply bonding wire when the calculated common mode noise is not equal to or less than a threshold value; and by repeating the generating, the calculating and the changing until the common mode noise is equal to or less than a threshold value. The setting is achieved by setting a value of a half of the length of the first power supply bonding wire as the initial value of the length of the second power supply bonding wire.

In the interconnection structure of the present invention, the signal bonding wire, the ground bonding wire and the power supply bonding wire are arranged as follows. That is, one of the ground bonding wire and the power supply bonding wire is contained in the first envelope which is the same as the signal bonding wire, and the other is contained in another second envelope. Thus, the electromagnetic coupling between the signal bonding wire and a bonding wire which is contained in the second envelope is set to be smaller than the electromagnetic coupling between the two bonding wires which are contained in the first envelope.

BRIEF DESCRIPTION OF THE DRAWINGS

The above and other objects, advantages and features of the present invention will be more apparent from the following description of certain embodiments taken in conjunction with the accompanying drawings, in which:

FIG. 8C is a front view showing the interconnection structure in FIG. 8A;

FIG. 10A is a perspective view showing the interconnection structure according to a third embodiment of the present invention;

FIG. 10B is a top view showing the interconnection structure in FIG. 10A;

FIG. 10C is a front view showing the interconnection structure in FIG. 10A;

FIG. 10D is a sectional view of the interconnection structure along the line A-A' in FIG. 10B;

FIG. 10E is a side view showing the interconnection structure in FIG. 10A;

DESCRIPTION OF EMBODIMENTS

Hereinafter, an interconnection structure and a method of designing the interconnection structure according to the present invention will be described below with reference to the attached drawings.

First Embodiment

Figure 1A:
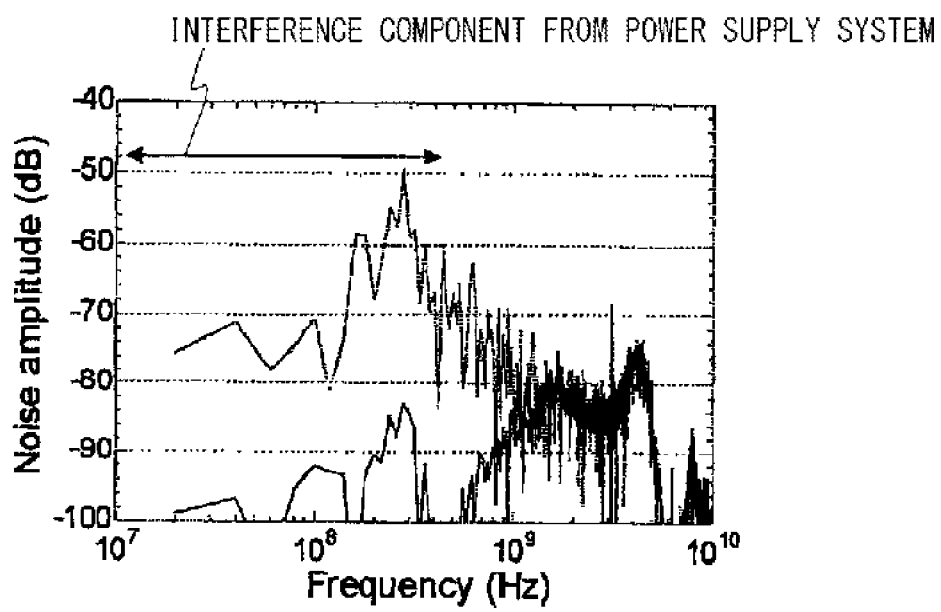
FIG. 1A is a graph showing a conventional case where an interposer has bonding wires.
Figure 1B:
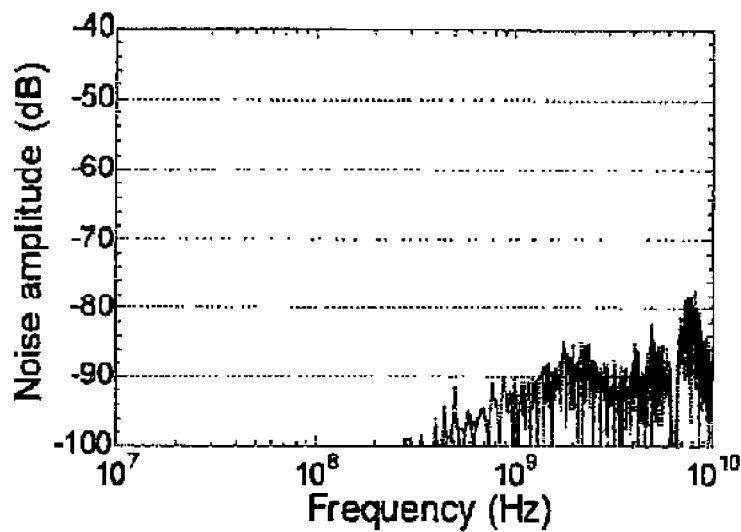
FIG. 1B is a graph showing a conventional case where an interposer is of a flip-chip type.
Figure 2A:
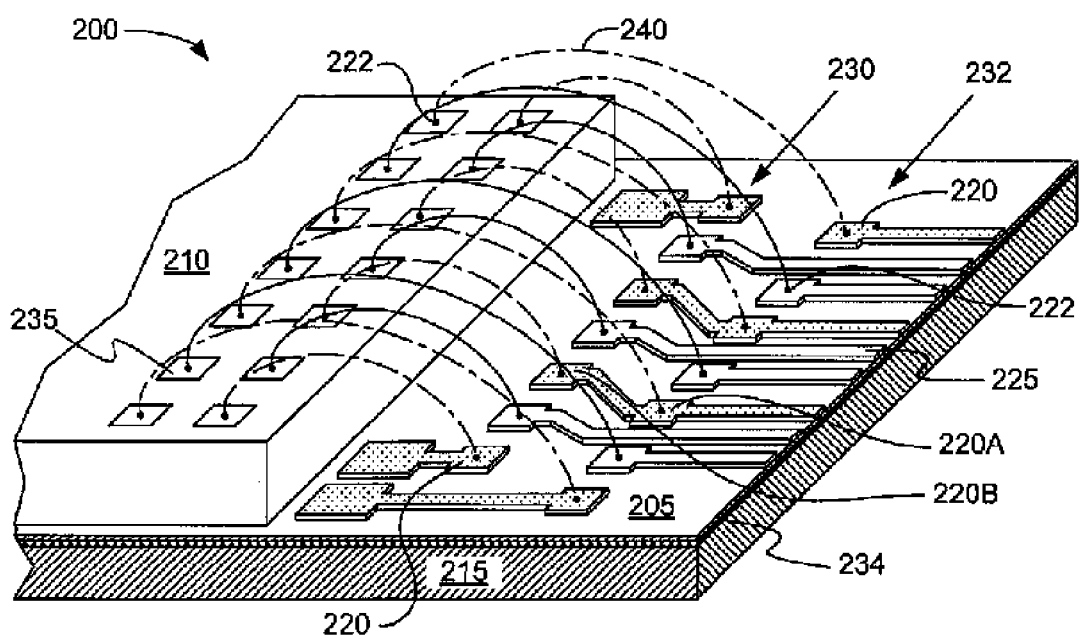
FIG. 2A is a perspective view showing the conventional arrangement of bonding wires.
Figure 2B:
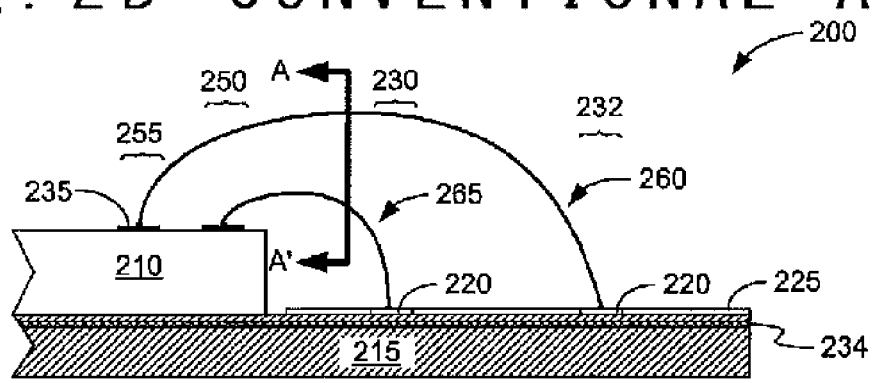
FIG. 2B is a side view showing the conventional arrangement of the bonding wires.
Figure 2C:
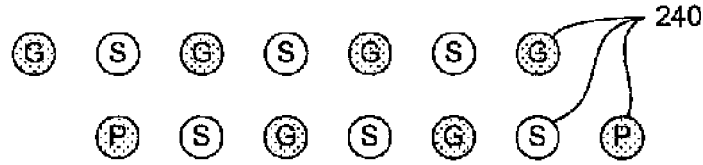
FIG. 2C is a sectional view of the bonding wires along the line A-A' in FIG. 2B.
Figure 3:
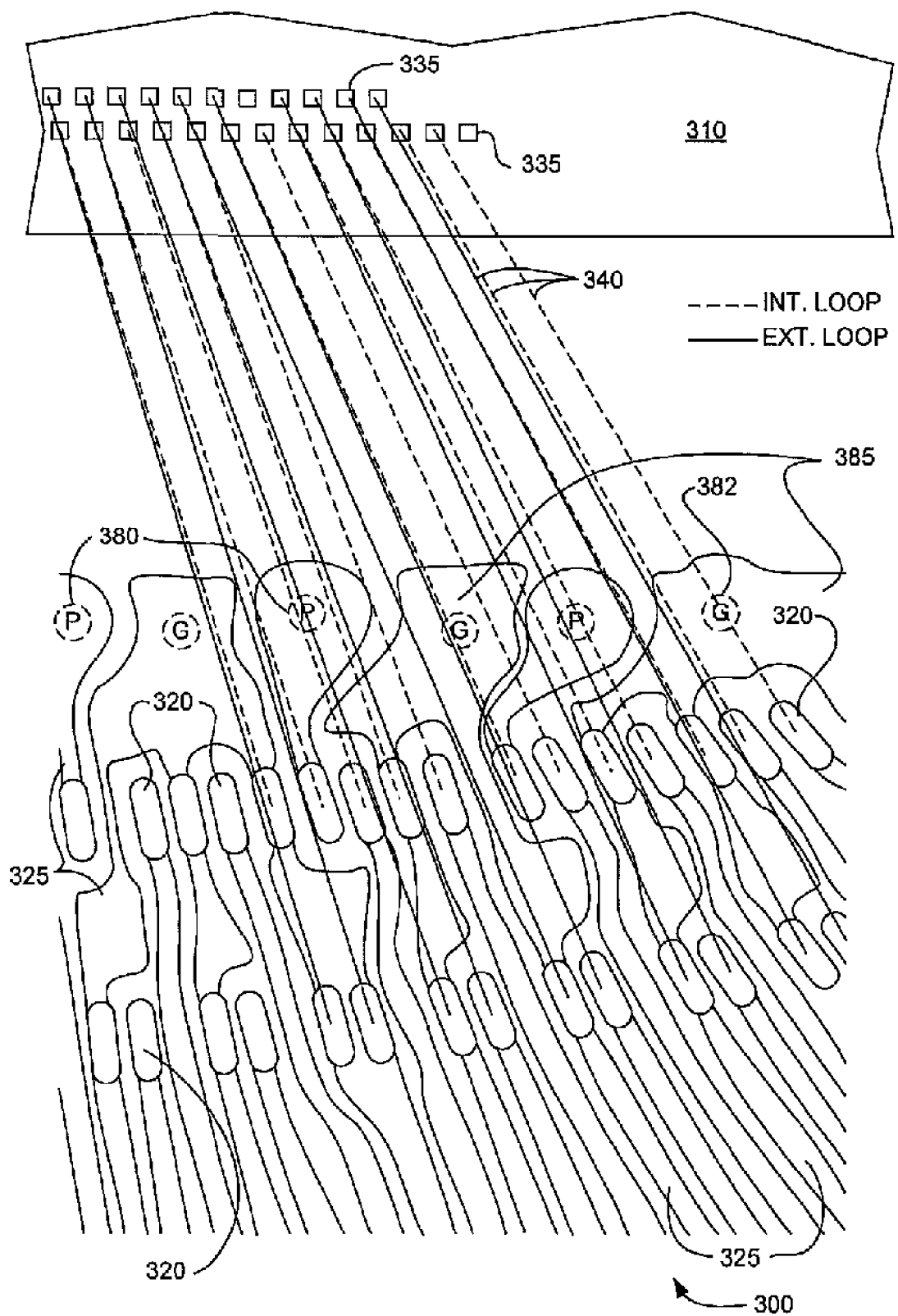
FIG. 3 is a plan view showing another conventional example of the arrangement of bonding wires which connect an LSI chip and an interposer substrate shown in Patent Literature 1.
Figure 4A:
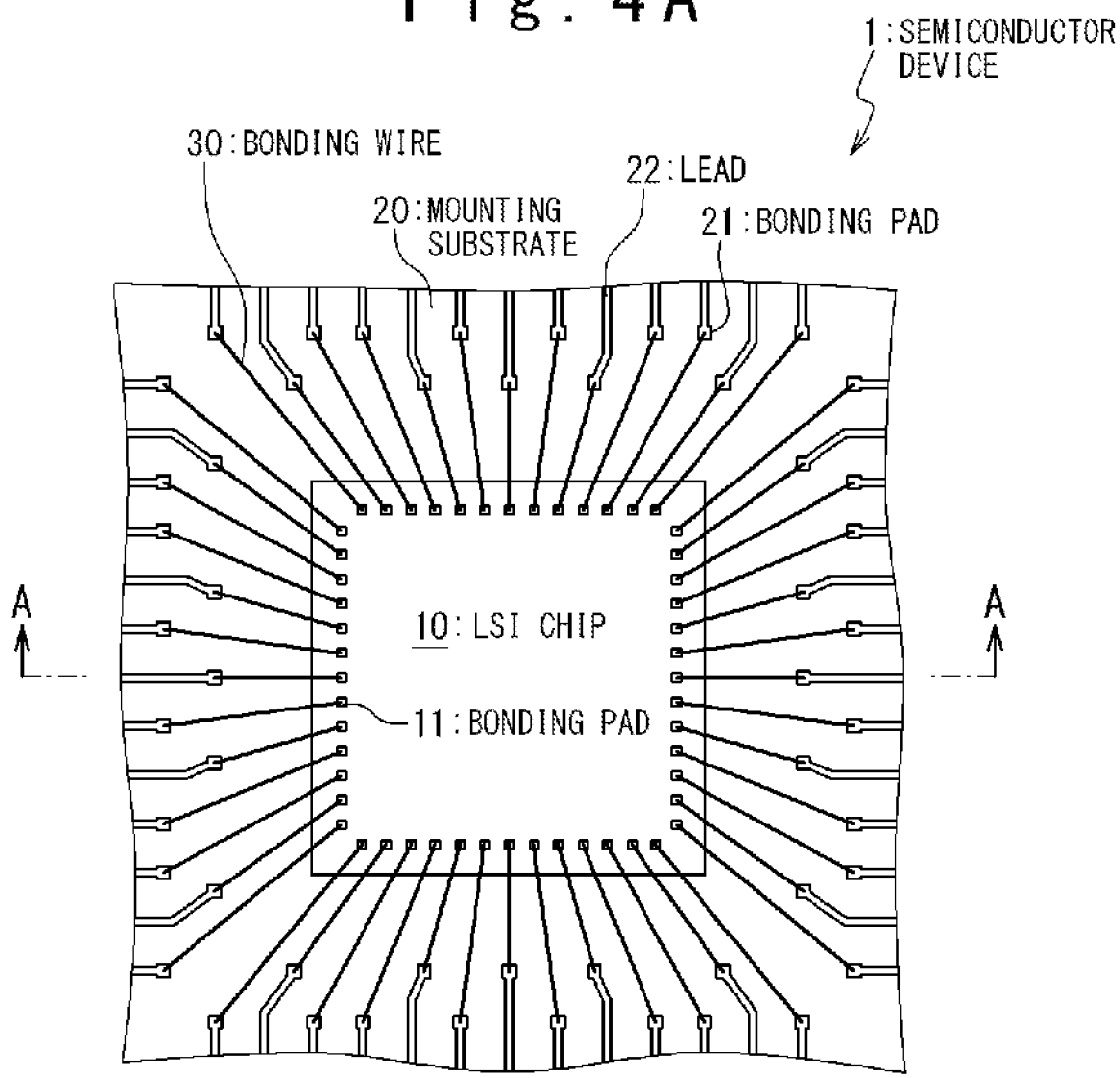
FIGS. 4A and 4B are a plan view and a cross sectional view schematically showing the overall configuration of a semiconductor device using an interconnection structure according to a first embodiment of the present invention.
Figure 4B:
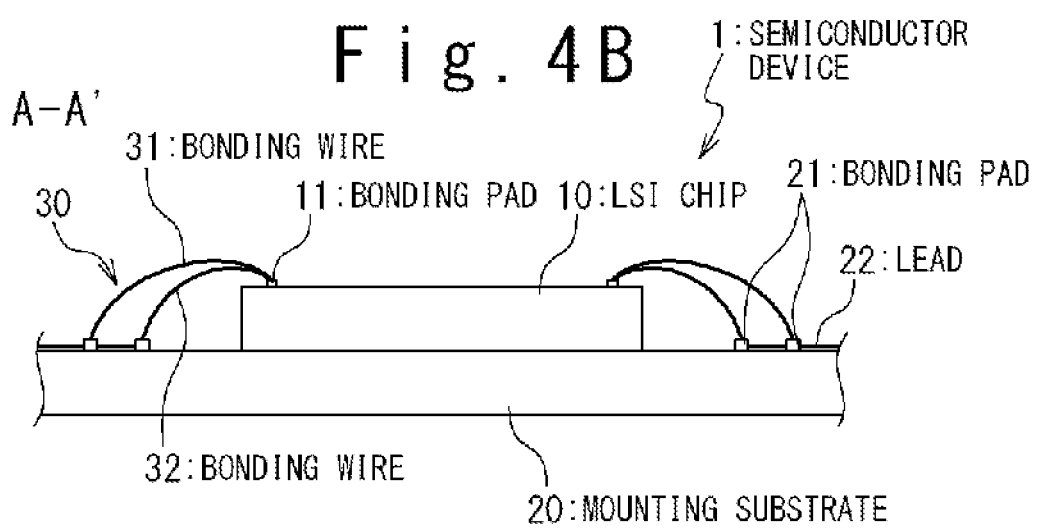

FIGS. 4A and 4B are a plan view and a cross sectional view schematically showing the overall configuration of a semiconductor device adopting the interconnection structure according to a first embodiment of the present invention.

The semiconductor device of FIG. 4A is provided with an LSI chip 10, a mounting substrate 20 and bonding wires 30. The LSI chip 10 is provided with bonding pads 11. The mounting substrate 20 is provided with bonding pads 21 and leads 22.

The LSI chip 10 is mounted on the mounting substrate 20. The both ends of the bonding wire 30 are connected with the bonding pad 11 of the LSI chip 10 and the bonding pad 21 of the mounting substrate. The bonding pad 21 of the mounting substrate 20 is connected with the lead 22. The lead 22 is connected with an optional circuit (not shown).

Part of the bonding wires 31 is contained in an identical envelope. These bonding wires are referred to as a first group of bonding wires 31 and the envelope is referred to as a first envelope. Also, another part of the bonding wires 32 is contained in another identical envelope. These bonding wires are referred to as a second group of bonding wires 32 and the envelope is referred to as a second envelope. It should be noted that the second envelope is located between the first envelope and the surface of the mounting substrate 20. In other words, the second envelope is located inside the first envelope.

Figure 5A:
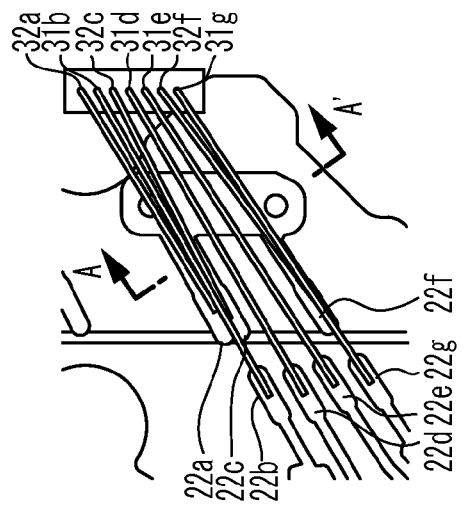
FIG. 5A is a perspective view showing the interconnection structure according to the first embodiment of the present invention.
Figure 5B:
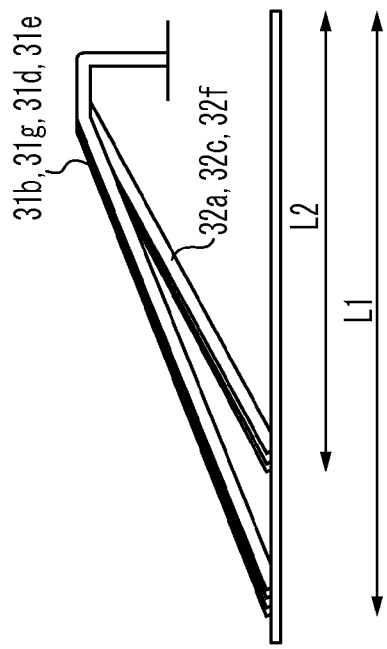
FIG. 5B is a plan view of the interconnection structure.
Figure 5C:
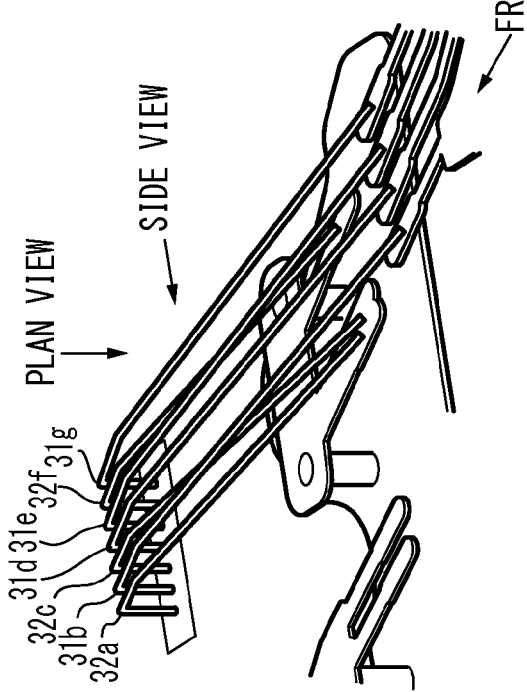
FIG. 5C is a front view of the interconnection structure.
Figure 5D:
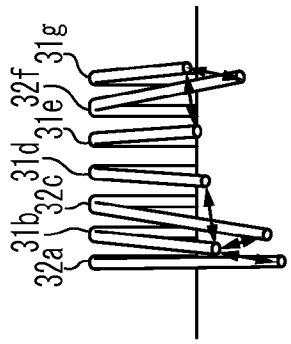
FIG. 5D is a sectional view of the interconnection structure along the line A-A' in FIG. 5B.
Figure 5E:
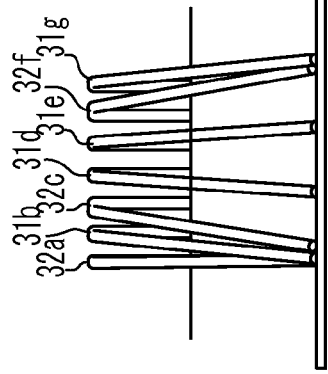
FIG. 5E is a side view of the interconnection structure shown in FIG. 5A.

FIGS. 5A to 5E shows the interconnection structure according to the first embodiment of the present invention. FIG. 5A is a perspective view showing the interconnection structure according to the first embodiment of the present invention. FIG. 5B is a plan view of the interconnection structure. FIG. 5C is a front view of the interconnection structure. FIG. 5D is a sectional view of the interconnection structure along the line A-A' in FIG. 5B. FIG. 5E is a side view of the interconnection structure shown in FIG. 5A.

The interconnection structure in the present embodiment is provided with the LSI chip 10, the mounting substrate 20 and the plurality of bonding wires. Although the first to seventh bonding wires 32a, 31b, 32c, 31d, 31e, 32f, and 31g of the interconnection structure according to the first embodiment of the present invention are shown in FIGS. 5A to 5E, the other bonding wires are omitted.

The LSI chip 10 is provided with the plurality of bonding pads 11. The mounting substrate 20 is provided with the plurality of bonding pads 21. It should be noted that in the present embodiment, an interposer substrate is used as the mounting substrate 20 but the substrate is not limited to it.

The first to seventh bonding wires 32a, 31b, 32c, 31d, 31e, 32f, and 31g are connected with the LSI chip 10 through the first to seventh bonding pads 11a to 11g, and the mounting substrate 20 through the first to seventh bonding pads 21a to 21g.

It is possible to see the first and second envelopes which contains first to seventh bonding wires 32a, 31b, 32c, 31d, 31e, 32f, and 31g in FIG. 5E. That is, the second bonding wire 31b, the fourth bonding wire 31d, the fifth bonding wire 31e, and the seventh bonding wire 31g are contained in the first envelope. Also, the first bonding wire 32a, the third bonding wire 32c, and the sixth bonding wire 32f are contained in the second envelope.

In other words, the second, fourth, fifth, and seventh bonding wires 31b, 31d, 31e, and 31g are arranged approximately in parallel to each other. This may be expressed as the profiles of the second, fourth, fifth, and seventh bonding wires 31b, 31d, 31e, and 31g are the same. In the same way, the first, third, and sixth bonding wires 32a, 32c, and 32f are arranged approximately in parallel to each other. Therefore, the profiles of the first, third, and sixth bonding wires 32a, 32c, and 32f are the same but is different from the profiles of the second, fourth, fifth, and seventh bonding wires.

It is possible to see in FIG. 5B that the above two types of profiles are different from each other. Especially, the first and third bonding wires 32a and 32c are arranged to be slipped under the second bonding wire 31b. In the same way, the sixth bonding wire 32f is arranged to be slipped under the seventh bonding wire 31g.

Moreover, it is possible to see in FIG. 5B that a difference has occurred in the arrangement of bonding pads 21a to 21g on the mounting substrate 20 due to the difference between the profiles. That is, the first, third and sixth bonding pads 21a, 21c, and 21f connected with the first, third, and sixth bonding wires 32a, 32c, and 32f are arranged in the positions nearer to the LSI chip 10 than the other bonding pads 21b, 21d, 21e, and 21g.

The second and seventh bonding pads 22b and 22g are connected to the ground (not shown). The first, third, and sixth bonding pads 22a, 22c, and 22f are connected with the power supply voltage (not shown).

In the present embodiment, the fourth and fifth bonding wires 31d and 31e function as signal bonding wires for a differential signal in a pair between LSI chip 10 and the mounting substrate 20. The second and seventh bonding wires 31b and 31g function as ground bonding wires. The first, third and sixth bonding wires 32a, 32c and 32f function as power supply bonding wires.

It should be noted that it is not directly related with the present invention that the signal bonding wires 31d and 31e transfer the differential signal. Therefore, in the interconnection structure of the present invention, the two signal bonding wires are not always required to be adjacent to each other and the number of ground bonding wires which neighbor the signal bonding wire may be one.

In the interconnection structure of the present embodiment, the signal bonding wires 31d and 31e and the ground bonding wires 31b and 31g are arranged to extend from the LSI chip 10 to the mounting substrate 20 in parallel. With this, the impedance, which is originally too high, of the bonding wire is reduced. As a result, the impedance of the bonding wire becomes near to transmission line impedance of the mounting substrate 20 and transmission line impedance of the system board on which the semiconductor device 1 of the present invention is mounted. Moreover, skew between the signal bonding wires 31d to 31e becomes approximately 0.

In addition, noise interference is minimized from a power supply circuit to a signal circuit through the power supply bonding wires 32a, 32c and 32f and the signal bonding wires 31d and 31e in the structure of FIGS. 5A to 5E. This principle will be described with reference to FIGS. 6A to 6D.

Figure 6A:
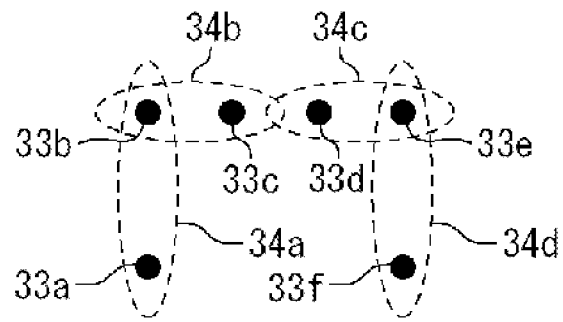
FIG. 6A is a sectional view showing the case where the interference of coupling field between a signal bonding wire and a ground bonding wire and coupling field between the ground bonding wire and the power supply bonding wire is minimized.
Figure 6B:
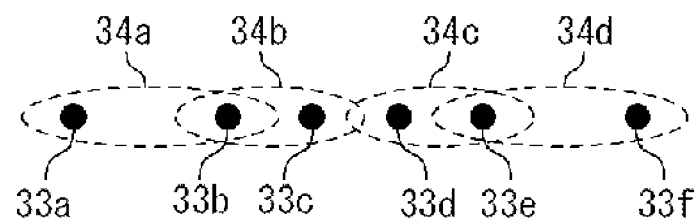
FIG. 6B is a sectional view showing a case where the interference of the coupling field between the signal bonding wire and the ground bonding wire and the coupling field between the ground bonding wire and the power supply bonding wire is maximized.
Figure 6C:
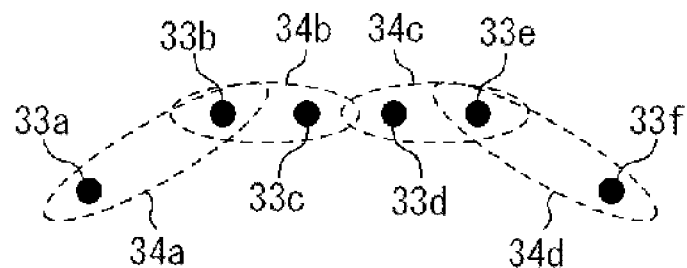
FIG. 6C is a sectional view showing a case where the interference of the coupling field between the signal bonding wire and the ground bonding wire and the coupling field between the ground bonding wire and the power supply bonding wire is made intermediate.
Figure 6D:
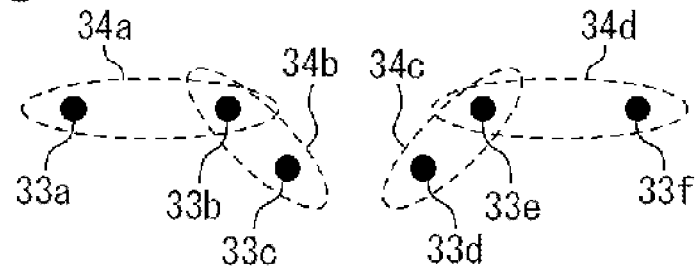
FIG. 6D is a sectional view showing another case were the interference of the coupling field between the signal bonding wire and the ground bonding wire and the coupling field between the ground bonding wire and the power supply bonding wire is made intermediate.

FIGS. 6A to 6D show a relation between a group of bonding wires and coupling field between the bonding wires. FIG. 6A is a sectional view showing a case where the interference between the coupling field between the signal bonding wire and the ground bonding wire and the coupling field between the ground bonding wire and the power supply bonding wire is minimized. FIG. 6B is a sectional view showing a case where the interference between the coupling field between the signal bonding wire and the ground bonding wire and the coupling field between the ground bonding wire and the power supply bonding wire is maximized. FIG. 6C is a sectional view showing a case where the interference between the coupling field between the signal bonding wire and the ground bonding wire and the coupling field between the ground bonding wire and the power supply bonding wire is made intermediate. FIG. 6D is a sectional view showing another case were the interference between the coupling field between the signal bonding wire and the ground bonding wire and the coupling field between the ground bonding wire and the power supply bonding wire is made intermediate.

The bonding wire group of FIGS. 6A to 6D is provided with the first to sixth bonding wire 33a to 33f. Here, the first and sixth bonding wires 33a and 33f are the power supply bonding wires. The second and fifth bonding wires 33b and 33e are the ground bonding wires. The third and fourth bonding wires 33c and 33d are the signal bonding wires.

In FIGS. 6A to 6D, the first to fourth coupling fields 34a to 34d occur between the adjacent bonding wires. The first coupling field 34a occurs between the first and second bonding wires 33a and 33b. The second coupling field 34b occurs between the second and third bonding wires 33b and 33c. The third coupling field 34c occurs between the fourth and fifth bonding wires 33d and 33e. The fourth coupling field 34d occurs between the fifth and sixth bonding wires 33e and 33f. It should be noted that because the third and fourth bonding wires 33c and 33d are neighbor to each other, fifth coupling field should occur between them, of course. However, because it is not necessary to describe the interference between the signal bonding wires for the description of the interference between the signal bonding wire and the power supply bonding wire, the description of the interference between the signal bonding wires is omitted.

In FIGS. 6A to 6D, the reason why the second and third coupling fields 34b and 34c occur is that the ground bonding wires 33b and 33e function as return paths for the adjacent signal bonding wires 33c and 33d. In the same way, the reason why the first and fourth coupling fields 34a and 34d occur is that the power supply bonding wire 33a and the ground bonding wire 33b function as return paths for each other, and the ground bonding wire 33e and the power supply bonding wire 33f function as return paths for each other.

It should be noted that these coupling fields 34a to 34d may be considered as magnetic force lines or an envelope line of electric force lines.

In FIG. 6B, the coupling field 34a between the ground bonding wire and the power supply bonding wire and the coupling field 34b between the signal bonding wire and the ground bonding wire are parallel to each other. In this case, the two coupling fields 34a and 34b are in either of the state that the fields are directed in the same direction or the state the fields are directed in the opposite directions. That is, the two coupling fields 34a and 34b are in the state that the two fields strengthen or weaken. Moreover, the coupling field 34c between the signal bonding wire and the ground bonding wire and the coupling field 34d between the ground bonding wire and the power supply bonding wire are in parallel to each other. Therefore, the propagation of the common mode noise from the power supply circuit to the signal circuit is maximum in the structure of FIG. 6B.

From this viewpoint, the propagation of the common mode noise from the power supply circuit to the signal circuit becomes minimum when the coupling fields 34a and 34d between the ground bonding wire and the power supply bonding wire, and the coupling fields 34b and 34c between the signal bonding wire and the ground bonding wire are respectively orthogonal to each other, as in FIG. 6A. At this time, a scalar product (inner product) of the field vectors takes a value which is near 0, and therefore, the energy propagation becomes the smallest.

Also, like FIG. 6C and FIG. 6D, when the coupling fields 34a and 34d between the ground bonding wire and the power supply bonding wire, and the coupling fields 34b and 34c between the signal bonding wire and the ground bonding wire respectively intersect at an angle in a range between 90° and 180°, the common mode noise from the power supply circuit to the signal circuit propagates with an intermediate intensity.

Therefore, as in FIG. 6A, the structure is ideal in which a plane formed from the signal bonding wire and the ground bonding wire and a plane formed from the power supply bonding wire and the ground bonding wire are orthogonal to each other. As understood from FIG. 5D, in the present embodiment, based on this principle, the position relation of the bonding wires is set in a 3-dimensional manner.

It should be noted that the plane formed from the two bonding wires is actually a curved plane in many cases. In such a case, it is difficult to define the orthogonality between two planes. For this reason, a reference point is set on the power supply bonding wire, and a first linear line is assumed between the reference point and a point which is the nearest to the reference point on the signal bonding wire. In the same way, the second linear line is assumed between the reference point and a point which is the nearest to the reference point on the ground bonding wire. It is desirable that the first and second linear lines are orthogonal to each other at the reference point. Moreover, it is desirable that such a reference point exists on the power supply bonding wire at a plurality of points.

The principle of the present invention is in that the directions of the first and second coupling fields between the bonding wires are made close to a right angle. Here, the first coupling field is the coupling field between the first bonding wire propagating the signal and the second bonding wire functioning as the return path for this signal. Also, the second coupling field is the coupling field between the third bonding wire applied with the power supply voltage and the second bonding wire functioning as the return path for the power supply voltage.

It should be noted that the power supply bonding wire can function as the return path for the signal bonding wire. Also, the power supply bonding wire and the ground bonding wire can function as the return paths each other. Therefore, even if the power supply bonding wire and the ground bonding wire are exchanged between them, the same effect is obtained in the present invention. Describing in detail, when the ground wiring line is set as the signal return path, a noise source to the signal bonding wire is a voltage source, i.e. the power supply wire which changes in potential in a manner different from the ground. Oppositely, when the power supply bonding wire is set as the signal return path, the ground which is a voltage source which changes in potential in a manner different from the power supply is a noise source to the signal.

Also, in the present invention, the only necessary condition is the angular relation between the two coupling fields. Therefore, a relation of the envelopes corresponding to the plurality of profiles of the bonding wires, i.e. a relation of the sections of the bonding wires does not take direct effect. For example, even if the power supply bonding wire is arranged above the ground bonding wire, there is no hinderance at all. It should be noted that in this case, on the mounting substrate, the power supply bonding pad is arranged on a far side from the LSI chip, and the signal or ground bonding pad is arranged on a near side from the LSI chip.

Next, a ratio in length between the bonding wires will be described. As shown in FIG. 5E, the lengths of the ground bonding wires $31b$ and $31g$ which are contained in the same envelope as the signal bonding wire, namely, which have the same profile as the signal bonding wire, are supposed to be L1. In the same way, the lengths of the power supply bonding wires $32a$, $32c$ and $32f$ which are contained in the envelope different from the signal bonding wire, namely, which have a different profile are supposed to be L2. In the present invention, the optimal ratio exists in these wire lengths L1 and L2.

According to the simulation results of various examples, the optimal ratio is L1:L2=1:0.6, although the ratio depends on the difference in the height of each of the bonding pads between on the semiconductor chip and on the mounting substrate.

This optimal ratio is theoretically described as follows. In order to reduce noise propagation from the power supply circuit to the signal circuit, power supply noise itself is made small or interference between the signal circuit and the power supply circuit is made small.

In case where a first plane containing the signal bonding wire and the ground bonding wire and a second plane containing the ground bonding wire and the power supply bonding wire are orthogonal to each other, if the length of the power supply bonding wire is made long, in other words, if a distance for which the power supply bonding wire and the ground bonding wire extend in parallel is made long, the interference between the signal circuit and the power supply circuit becomes small because a range for which the orthogonality relation of the coupling fields is kept becomes wide. However, because the power supply impedance increases more if the power supply bonding wire becomes longer, the power supply noise increases at the same time.

Oppositely, if the length of the power supply bonding wire is made short, the power supply noise becomes small but the interference between the signal circuit and the power supply circuit becomes large. Although depending on the design of the substrate on which the semiconductor device is mounted, and the decoupling capacitance on the LSI chip, an optimal length ratio of these wires is roughly theoretically 1:2, that is, the length of a shorter bonding wire is half of length of a longer bonding wire. The ratio of 1:0.6 obtained in the above-mentioned simulation is obtained in the structure according to the first embodiment of the present invention and can be sufficiently consented.

In an early stages of so-called silicon package board co-design often performed in recent years, the data of silicon and board to be used for the package design are unknown or bad in precision. In such a case, to design a bonding wire profile, an initial value of 50% is employed as the length ratio and the package can be efficiently designed. Also, the initial value of 50% in the length ratio attains maximum stability to any change of an unknown element.

Figure 7A:
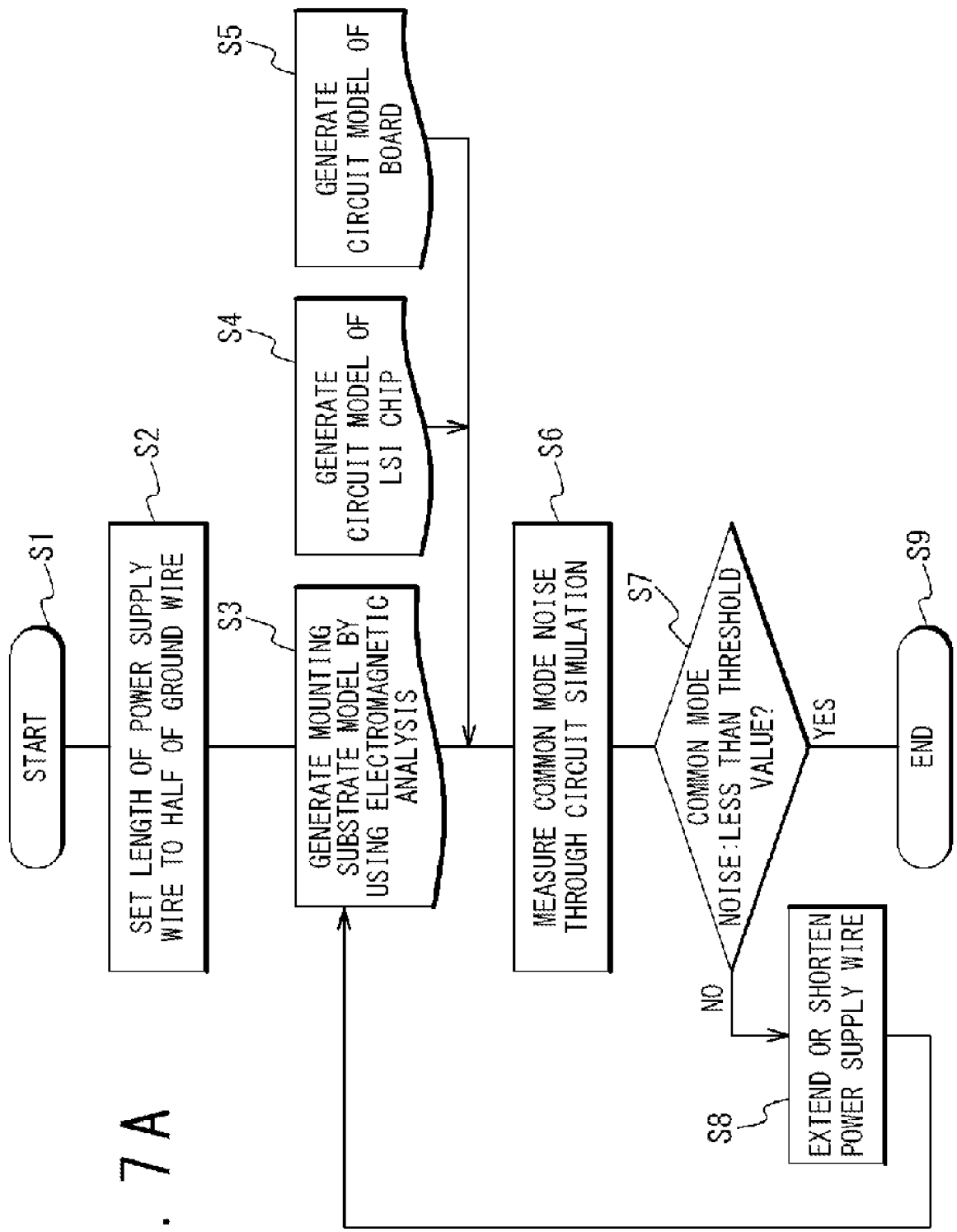
FIG. 7A is a flow chart of a method of designing the interconnection structure according to the first embodiment of the present invention.
Figure 7B:
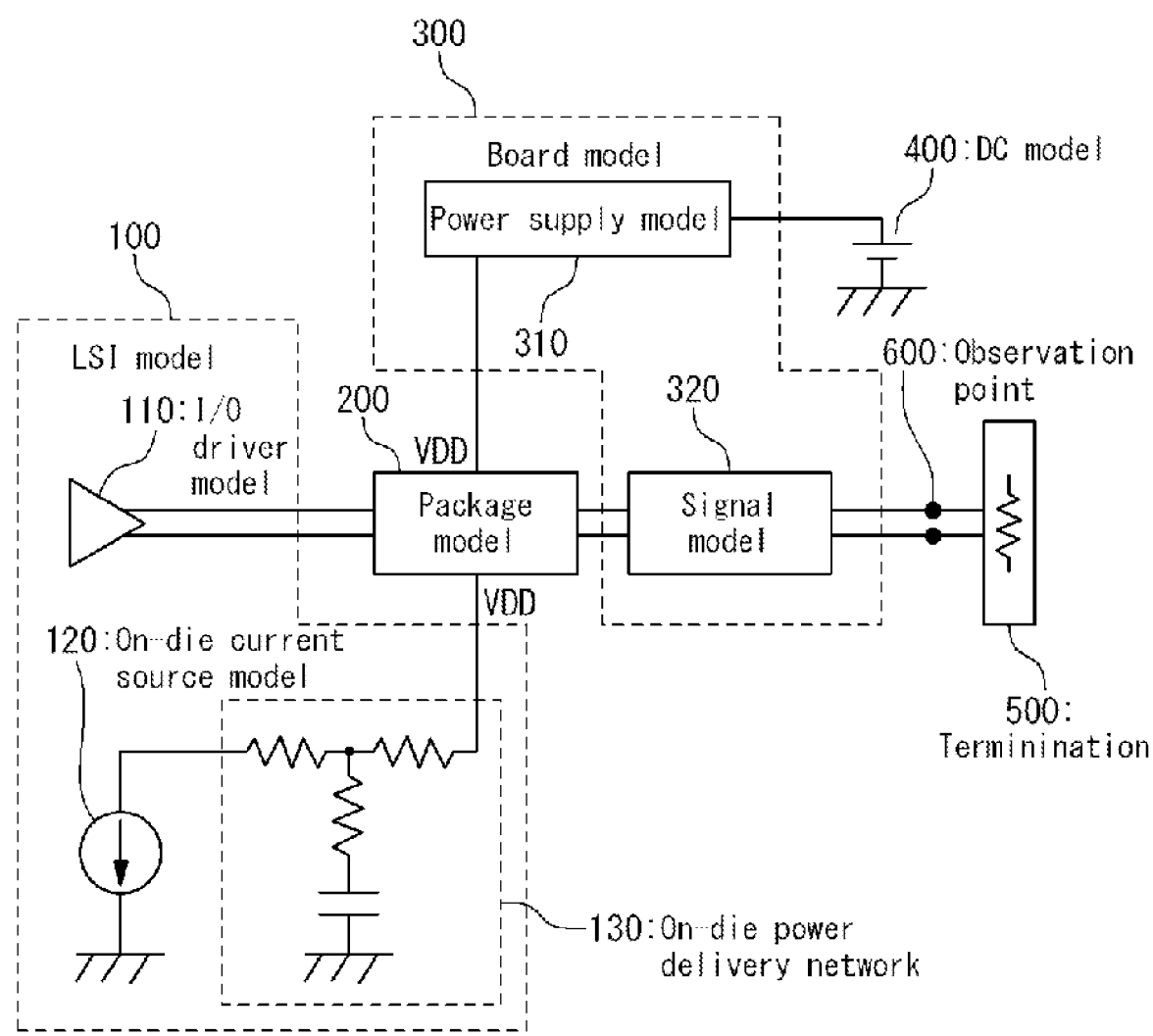
FIG. 7B is a block diagram showing the structure of a circuit model used in the method of designing interconnection structure according to the first embodiment of the present invention.

Here, a method of designing the interconnection structure according to the first embodiment of the present invention will be described with reference to FIGS. 7A and 7B. FIG. 7A is a flow chart of the method of designing the interconnection structure according to the first embodiment of the present invention. FIG. 7B is a block diagram showing the structure of a circuit model used in the method of designing interconnection structure according to the first embodiment of the present invention.

The components of the circuit model in FIG. 7B will be described. The circuit model in FIG. 7B is provided with an LSI (chip) model section 100, a package model section 200, a board model section 300, a DC (power) model section 400, a termination section 500 and observation points 600.

The LSI chip model section 100 is provided with an input/output circuit model (I/O driver model) section 110, an on-die current source model section 120 and an on-die power delivery network model section 130.

The package model section 200 contains models of a signal bonding wire, a ground bonding wire, a power supply bonding wire, and so on.

The board model section 300 is provided with a power supply circuit model section 310 and a signal (circuit) model section 320.

The connection relation of the components in the circuit model of FIG. 7B will be described. The input/output circuit model section 110 is connected with the package model section 200. The on-die current source model section 120 is connected with the package model section 200 through the on-die power delivery network model section 130. The package model section 200 is connected with the power supply circuit model section 310 and the signal circuit model section 320. The power supply circuit model 310 is connected with the DC power model section 400. The signal circuit model section 320 is connected with the termination section 500.

It should be noted that the observation points 600 are set to connection points between the signal circuit model section 320 and the termination model section 500.

The flow chart in FIG. 7A will be described. The flow chart in FIG. 7A is provided with steps S1 to S9.

Step S1:
The method of designing the interconnection structure of the present invention is started at the step S1. After the step S1, the control flow advances to a step S2.

Step S2:
An initial value of the length of the power supply bonding wire is set to half of the length of the ground bonding wire at the step S2. After the step S2, the control flow advances to a step S3.

Step S3:
The mounting substrate model 200 is generated by using the electromagnetic field analysis at the step S3. After the step S3, the control flow advances to a step S6.

Step S6:
It should be noted that it is desirable to provide the LSI chip model 100 and the circuit model 300 of the board in advance at a step S4 and a step S5, respectively, before the step S6. The steps S4 and S5 may be executed anytime before the step S6 and may use existing data.

The common mode noise is measured at the observation points 600 through the circuit simulation at the step S6. The respective models obtained at the steps S3 to S5 are used for this circuit simulation. After the step S6, the control flow advances to a step S7.

Step S7:
Whether or not the common mode noise obtained at the step S6 is equal to or less than a threshold value is confirmed at the step S7. If the common mode noise is equal to or less than the threshold value, the control flow advances to a step S9, and otherwise, the control flow advances to a step S8.

Step S8:
The length of the power supply bonding wire is elongated or shortened at the step S8. At this time, because the length of the power supply bonding wire should be changed to be decrease the common mode noise, whether the length is elongated or shortened should be determined in advance. After the step S8, the control flow returns to the step.

Step S9:

The method of designing the interconnection structure of the present invention is ended at the step S9.

Second Embodiment

Figure 8A:
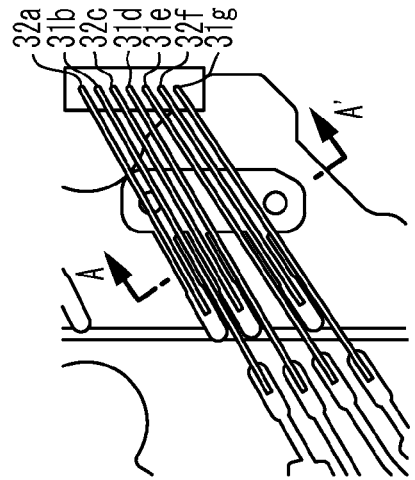
FIG. 8A is a perspective view showing the interconnection structure according to a second embodiment of the present invention.
Figure 8B:
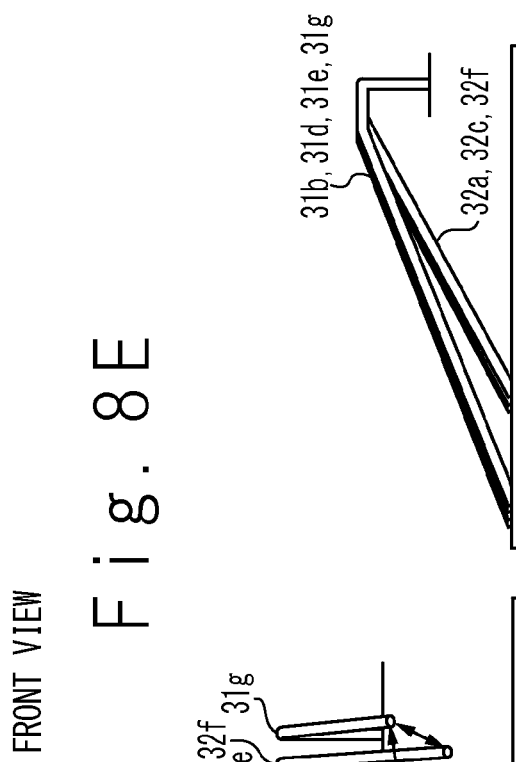
FIG. 8B is a top view showing the interconnection structure in FIG. 8A.
Figure 8D:
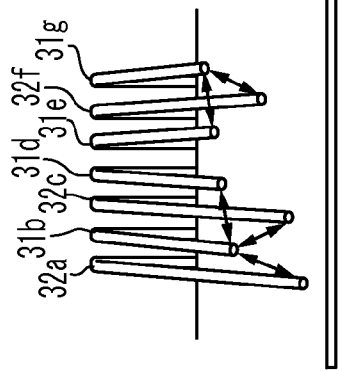
FIG. 8D is a sectional view showing the interconnection structure along the line A-A' in FIG. 8B.
Figure 8E:
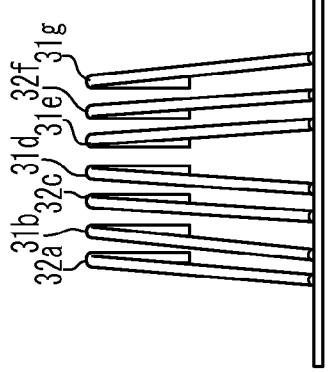
FIG. 8E is a side view showing the interconnection structure in FIG. 8A.

FIGS. 8A to 8E show the interconnection structure according to a second embodiment of the present invention. FIG. 8A is a perspective view showing the interconnection structure according to the second embodiment of the present invention. FIG. 8B is a top view showing the interconnection structure in FIG. 8A. FIG. 8C is a front view showing the interconnection structure in FIG. 8A. FIG. 8D is a sectional view showing the interconnection structure along the line A-A' in FIG. 8B. FIG. 8E is a side view showing the interconnection structure in FIG. 8A.

The present embodiment of the present invention is different from the first embodiment in that positions of the power supply bonding pads 21a 21c, and 21f on the mounting substrate are changed. As a result, as seen from FIGS. 8A, 8B, 8C and 8D, the directions of the power supply bonding wires 32a, 32c, and 32f, too, are changed. However, as seen from FIG. 8E, the profile of the power supply bonding wires 32a, 32c, and 32f is the same as in the first embodiment of the present invention. In other words, the envelope containing of the power supply bonding wires 32a, 32c, and 32f is also the same as in the first embodiment of the present invention. Because the other components, the connection relation, the operation and so on are the same as those in the first embodiment of the present invention, the description thereof is omitted.

In the first embodiment of the present invention, the angle between the plane formed from the signal bonding wire and the ground bonding wire and the plane formed from the ground bonding wire and the power supply bonding wire is approximately 90°. However, in the present embodiment, the angle falls in a range of approximately 60° to approximately 120°. According to experiments, it was confirmed that if the above angle is equal to or larger than 60° and equal to or smaller than 120° in a region of a half of the full length of the shortest one of the signal bonding wire, the ground bonding wire, the power supply bonding wire, the common mode noise was reduced to a half, resulting in an enough effect. However, in any case, the bonding wire to be used as the return path for the signal bonding wire among the power supply bonding wire and the ground bonding wire needs to have the same profile as the signal bonding wire.

It should be noted that the reference planes which should be ranged between 60° to 120° are often curved planes actually. Therefore, it is desirable that the angle in this range can be obtained with respect to the reference point on a single bonding wire, as in the first embodiment of the present invention. Moreover, it is desirable that any in a region corresponding to half of the full length of the shortest bonding wire which is the shortest among the three bonding wires of the signal bonding wire, the ground bonding wire, and the power supply bonding wire meets a condition of such a reference point.

Here, using an example of the interconnection structure of the present embodiment, comparison with the conventional technique is performed. In the conventional interconnection structure, it is supposed that the power supply bonding wires 32a, 32c, and 32f in FIGS. 8A to 8E are elongated so that the power supply bonding wires 32a, 32c, and 32f have the same profile as that for the signal and ground bonding wires 31b, 31d, 31e, and 31g.

Figure 9A:
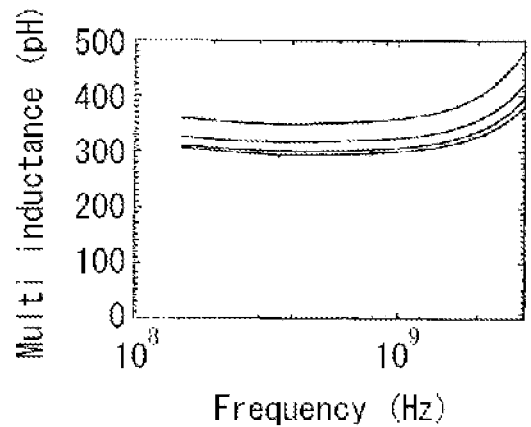
FIG. 9A shows mutual inductance in the conventional interconnection structure, i.e. coupling between the signal bonding wire and the power supply bonding wire.
Figure 9B:
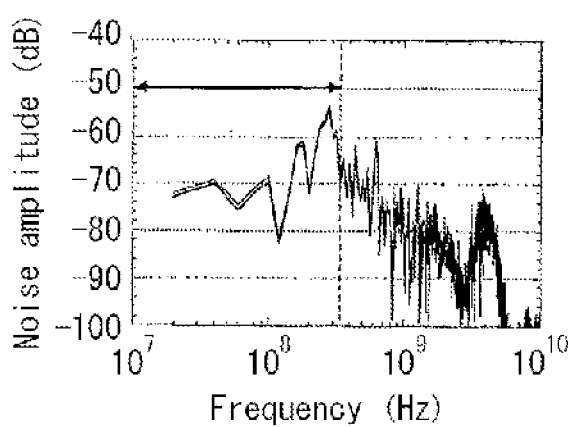
FIG. 9B shows a spectrum of a common mode output in the conventional interconnection structure.
Figure 9C:
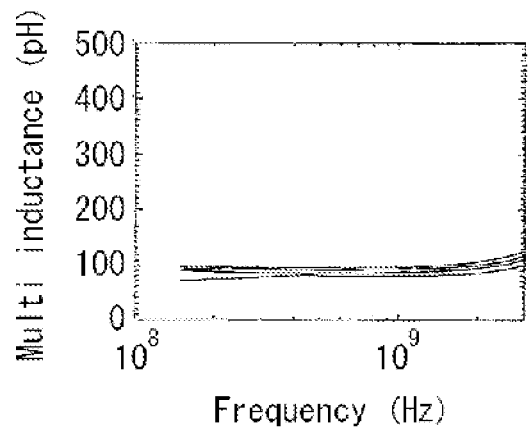
FIG. 9C shows a mutual inductance in the interconnection structure according to the second embodiment of the present invention.
Figure 9D:
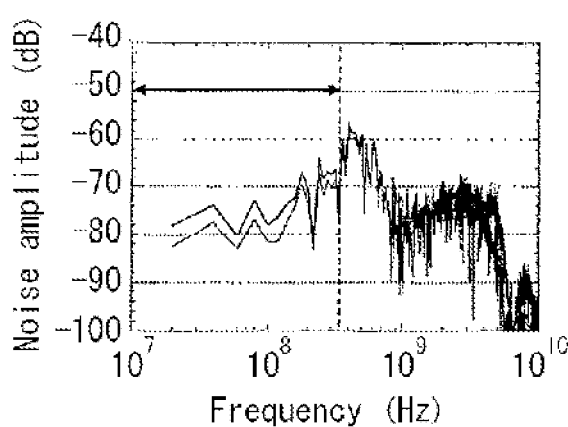
FIG. 9D shows a spectrum of a common mode output in the interconnection structure according to the second embodiment of the present invention.

FIGS. 9A to 9D show the comparison results between the conventional interconnection structure and the interconnection structure according to the second embodiment of the present invention. FIG. 9A shows mutual inductance in the conventional interconnection structure, i.e. coupling between the signal bonding wire and the power supply bonding wire. FIG. 9B shows a spectrum of a common mode output in the conventional interconnection structure. FIG. 9C shows a mutual inductance in the interconnection structure according to the second embodiment of the present invention. FIG. 9D shows a spectrum of a common mode output in the interconnection structure according to the second embodiment of the present invention.

As seen from FIGS. 9A to 9D, the mutual inductance between the signal bonding wire and the power supply bonding wire is reduced to a half or less of the inductance in a conventional example, actually approximately ⅓ of the conventional example. Also, as a result, it can be confirmed that a low frequency common-mode noise component transferred from the power supply to the signal line is reduced.

Third Embodiment

FIGS. 10A to 10E show the interconnection structure according to a third embodiment of the present invention. FIG. 10A is a perspective view shows the interconnection structure according to the third embodiment of the present invention. FIG. 10B is a top view showing the interconnection structure in FIG. 10A. FIG. 10C is a front view showing the interconnection structure in FIG. 10A. FIG. 10D is a sectional view of the interconnection structure along the line A-A' in FIG. 10B. FIG. 10E is a side view showing the interconnection structure in FIG. 10A.

The present embodiment of the present invention is different from the first embodiment in that the first bonding wire 32a is removed which functions as the power supply bonding wire and the position of the bonding pad 11 of the LSI chip 10 is changed. As a result, as seen from FIG. 10E, the second envelope containing the power supply bonding wires 32c and 32f is completely separated from the first envelope containing the ground bonding wires 31b, and 31g, and the signal bonding wires 31d and 31e and is arranged therein. In other words, the profiles of the power supply bonding wires 32c and 32f are approximately parallel to the profiles of the ground bonding wires 31b and 31g, and the signal bonding wires 31d and 31e. Moreover, as seen from FIG. 10B, the ground bonding wires 31b and 31g, and the signal bonding wires 31d and 31e are arranged approximately in parallel to each other. Also, the power supply bonding wires 32c and 32f pass approximately straightly below the ground bonding wires 31b and 31g. Because the other components, the connection relation, the operation and so on are the same as those of the first embodiment of the present invention, the description thereof is omitted.

In this way, according to the present embodiment, an area for the bonding pads 11 on the LSI chip 10 increases but the interconnection structure of the present invention can be realized more faithfully than the first and second embodiments of the present invention.

Fourth Embodiment

Figure 11A:
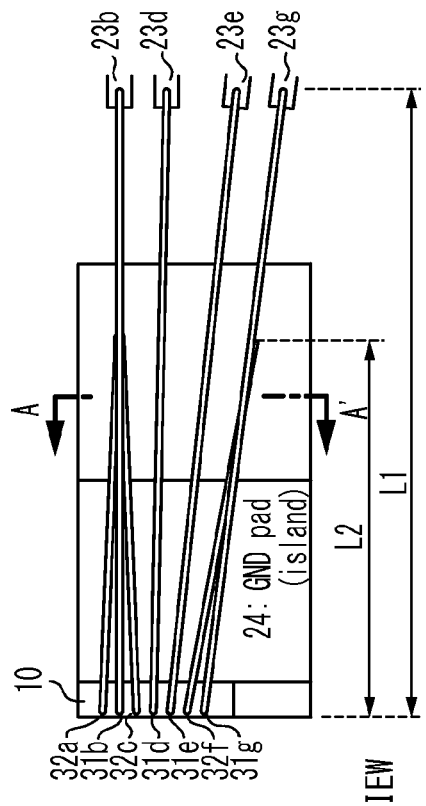
FIG. 11A is a perspective view showing the interconnection structure according to a fourth embodiment of the present invention.
Figure 11B:
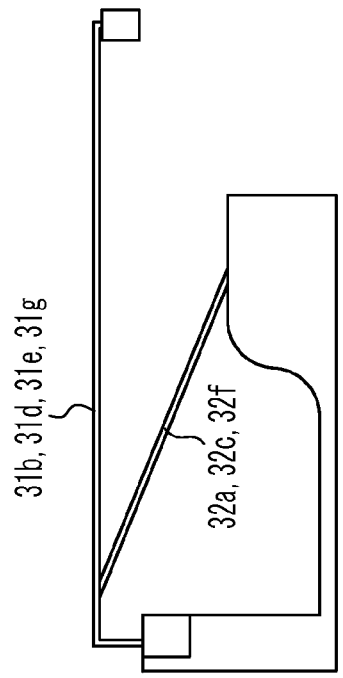
FIG. 11B is a top view showing the interconnection structure in FIG. 11A.
Figure 11C:
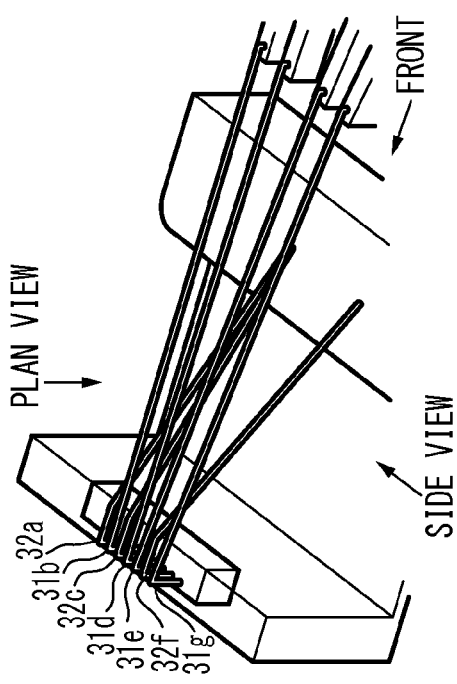
FIG. 11C is a front view showing the interconnection structure in FIG. 11A.
Figure 11D:
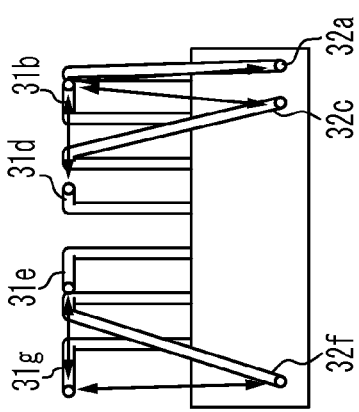
FIG. 11D is a sectional view of the interconnection structure along the line A-A' in FIG. 11B.
Figure 11E:
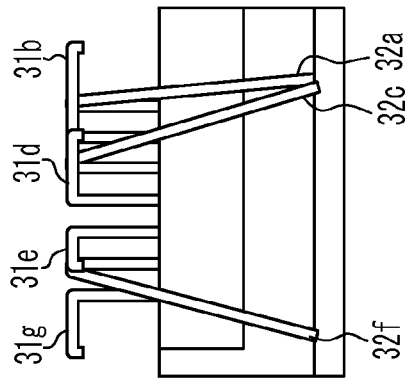
FIG. 11E is a side view showing the interconnection structure of FIG. 11A.

FIGS. 11A to 11E show the interconnection structure according to a fourth embodiment of the present invention. FIG. 11A is a perspective view showing the interconnection structure according to the fourth embodiment of the present invention. FIG. 11B is a top view showing the interconnection structure in FIG. 11A. FIG. 11C is a front view showing the interconnection structure in FIG. 11A. FIG. 11D is a sectional view of the interconnection structure along the line A-A' in FIG. 11B. FIG. 11E is a side view showing the interconnection structure of FIG. 11A.

As the mounting substrate 20 on which the LSI chip 10 is mounted, an interposer substrate is used in the first to third embodiments of the present invention. However, but in the present embodiment, a lead frame is used. The mounting substrate 20 of the present embodiment is provided with a die pad 24 on which the LSI chip is mounted, and lead pins 23b, 23d, 23e, 23g connected with the bonding wires. In an example shown in FIGS. 11A to 11E, the lead frame of a QFP (Quad Flat Package) type is used in which the die pad 24 is exposed.

In the present embodiment, the die pad 24 is used for mounting the LSI chip 10 as the bonding pads on the nearer side to the LSI chip 10 on the mounting substrate 20. Also, as the bonding pads on the far side from the LSI chip 10, the lead pins 23b, 23d, 23e, and 23g are used. Therefore, in the present embodiment, the role of the ground bonding wire and the role of the power supply bonding wire may be exchanged oppositely to the first to third embodiments of the present invention. That is, the first, third, and sixth bonding wires 32a, 32c and 32f connected with the bonding pads on the near side to the LSI chip 10 on the mounting substrate 20 function as the ground bonding wires in the present embodiment. Also, the second and seventh bonding wires 31b and 31g connected with the bonding pads on the far side from the LSI chip 10 on the mounting substrate 20 function as the power supply bonding wires. The role of the ground bonding wire or the power supply bonding wire, i.e. the fact that applied voltages can be exchanged is already described in the present invention. Because the other components, the connection relation, the operation and so on are the same as in the first embodiment of the present invention, the description thereof is omitted.

In this way, the interconnection structure of the present invention can be applied to a lead frame in addition to the interposer substrate used in the first to third embodiments of the present invention as the mounting substrate.

Fifth Embodiment

Figure 12:
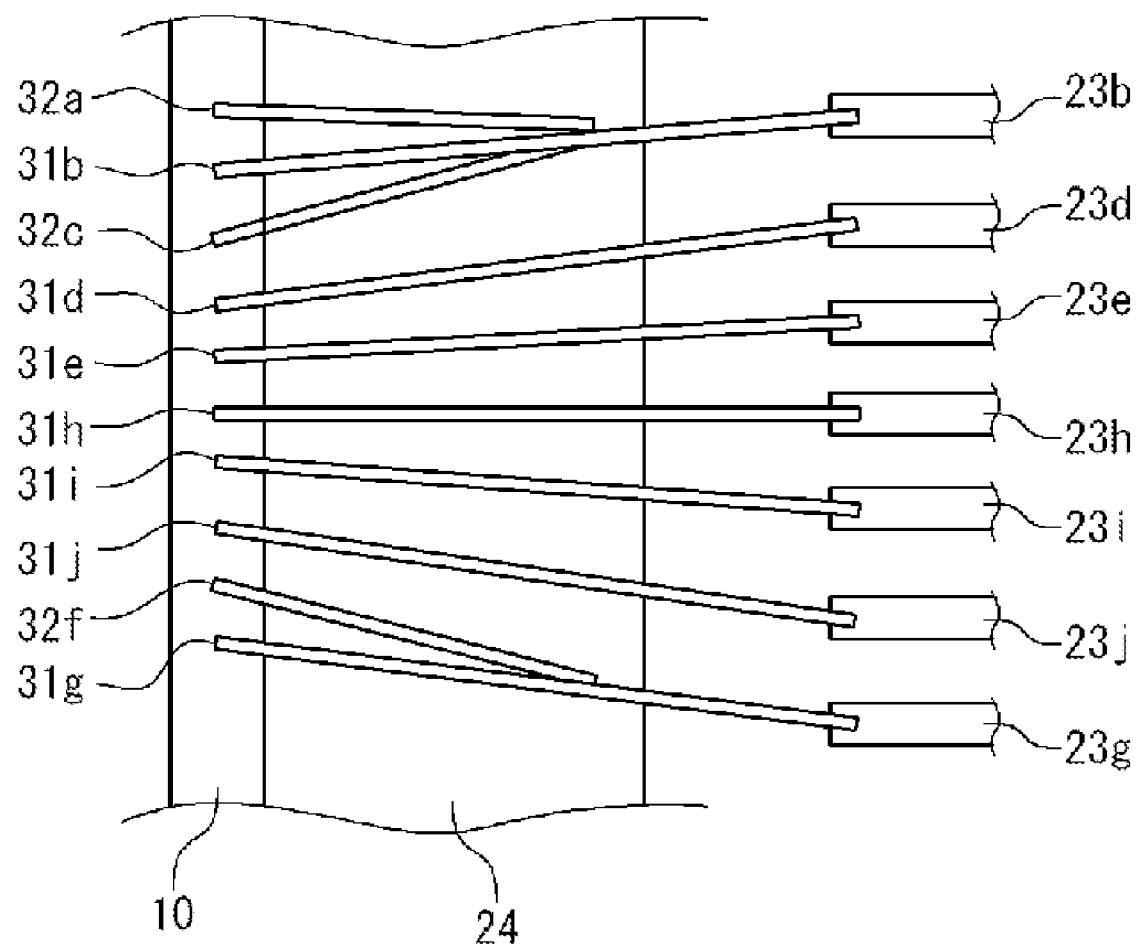
FIG. 12 is a plan view showing the interconnection structure according to a fifth embodiment of the present invention.

FIG. 12 is a plan view showing the interconnection structure according to a fifth embodiment of the present invention. The present embodiment is the same as an embodiment in which the eighth to tenth bonding wires 31h to 31j and three lead pins 23h to 23j are added to the fourth embodiment of the present invention.

The bonding wires 31h, 31i, and 31j are arranged in this order between the fourth bonding wire 31e functioning as the signal bonding wire and the sixth bonding wire 31f functioning as the ground bonding wire. In the same way, the lead pins 23h to 23j are arranged in this order between the fifth and sixth lead pins 23e and 23f. The bonding wires 31h, 31i, and 31j have a first profile, and are contained in the first envelope, like the second, fourth, fifth and the seventh bonding wires 31b, 31d, 31e, and 31g functioning as the power supply bonding wires or the signal bonding wires.

One ends of the eighth to tenth bonding wires 31h, 31i, and 31j are connected with the bonding pads of the LSI chip 10, and the other ends are connected with the lead pins 23h to 23j, respectively.

Because the other components, the connection relation, operation and so on are the same as in the first embodiment of the present invention, the description thereof is omitted.

The eighth bonding wire 31h functions as the power supply bonding wire. Also, the ninth and tenth bonding wires 31i and 31j function as signal bonding wires of a pair for a differential signal to be transferred. That is, in the present embodiment, two differential signals are transferred by using the signal bonding wires of two pairs. Generally, there is a possibility that interference, i.e. crosstalk is generated between the signal bonding wires of two pairs.

The advantage of the interconnection structure of the present invention which restrain the inter-signal interference, i.e. a crosstalk will be described with reference to a structure example shown in FIG. 12. The second, seventh, and eighth bonding wires 31b, 31g, and 31h functioning as the power supply bonding wires have the same profile as the fourth, fifth, ninth, and tenth bonding wires 31d, 31e, 31i, 13j functioning as the signal bonding wires, and are arranged approximately in parallel to each other. Therefore, a first pair of signal bonding wires 31d and 31e for transfer of a first differential signal, and a second pair of signal bonding wires 31i and 31j for transfer of a second differential signal are shielded over the full length by the eighth bonding wire 31h put between them. Therefore, the crosstalk is efficiently restrained between the first pair of signal bonding wires 31d and 31e and the second pair of signal bonding wires 31i and 31j.

As described above, the interconnection structure according to the embodiments of the present invention have been described. In either case, the signal bonding wire and the bonding wire functioning as the return path for the signal are arranged to have strong mutual impedance. Also, the power supply bonding wire and the bonding wire functioning as the return path for the power supply, too, are arranged to have strong mutual impedance. The reason for those is that in order to restrain interference between the signal and the power supply, it is essential to have the strong couplings between the signal and its return path and between the power supply and its return path. The interconnection structure of the present invention has strong coupling between the power supply bonding wire and its return-path bonding wire, i.e. the ground bonding wire. Thus, the present invention is effective to the reduction of the power supply impedance, not only to reducing the crosstalk.

As described above, the interconnection structure of the present invention attains the following matters:

(a) the restraint of interference and coupling between the power supply and the signal (restraint of the common mode noise);

(b) the restraint of power supply noise;

(c) the restraint of inter-signal interference and crosstalk; and (d) the restraint of signal reflection due to impedance discontinuity.

It should be noted that the embodiments can be freely combined in a range of no contradiction.

Although the present invention has been described above in connection with several embodiments thereof, it would be apparent to those skilled in the art that those embodiments are provided solely for illustrating the present invention, and should not be relied upon to construe the appended claims in a limiting sense.

What is claimed is:

1. An interconnection structure comprising a semiconductor chip, a mounting substrate on which said semiconductor chip is mounted, and a group of bonding wires provided to connect said semiconductor chip and said mounting substrate, wherein said group of bonding wires comprises:

a first signal bonding wire contained in a first envelope and provided to propagate a signal;

a first power supply bonding wire contained in said first envelope and applied with a first power supply voltage; and a second power supply bonding wire contained in a second envelope and applied with a second power supply voltage, wherein one of said first envelope and said second envelope is arranged between the other of said first envelope and said second envelope and said mounting substrate, and said second power supply bonding wire is arranged in a position in which electromagnetic coupling between said second power supply bonding wire and said first signal bonding wire is smaller than electromagnetic coupling between said second power supply bonding wire and said first power supply bonding wire.

2. The interconnection structure according to claim 1, wherein one of said first signal bonding wire and said first and second power supply bonding wires which has the shortest full length is the shortest bonding wire, wherein an optional point is set in a region of said shortest bonding wire corresponding to half of the full length, wherein a first linear line passes through the optional point and a point nearest to the optional point, on one of the remaining two bonding wires, wherein a second linear line passes through the optional point and a point nearest to the optional point, on the other of the remaining two bonding wires, and wherein an angle between said first and second linear lines is in a range of 60° to 120°.

3. The interconnection structure according to claim 1, wherein a first linear line passes through a predetermined point on said first power supply bonding wire and a point nearest to the predetermined point on said first signal bonding wire, a second linear line passes through the predetermined point on said first power supply bonding wire and a point nearest to the predetermined point on said second power supply bonding wire, and said first and second linear lines are orthogonal to each other.

4. The interconnection structure according to claim 1, wherein said group of bonding wires comprises:

a second signal bonding wire contained in said first envelope, and arranged in adjacent to said first signal bonding wire to transfer a differential signal together with said first signal bonding wire.

5. The interconnection structure according to claim 1, wherein said first power supply bonding wire is grounded.

6. The interconnection structure according to claim 1, wherein said second power supply bonding wire is grounded.

7. A semiconductor device with an interconnection structure which comprises a semiconductor chip, a mounting substrate on which said semiconductor chip is mounted, and a group of bonding wires provided to connect said semiconductor chip and said mounting substrate, wherein said group of bonding wires comprises:

a first signal bonding wire contained in a first envelope and provided to propagate a signal;

a first power supply bonding wire contained in said first envelope and applied with a first power supply voltage; and a second power supply bonding wire contained in a second envelope and applied with a second power supply voltage, wherein one of said first envelope and said second envelope is arranged between the other of said first envelope and said second envelope and said mounting substrate, and said second power supply bonding wire is arranged in a position in which electromagnetic coupling between said second power supply bonding wire and said first signal bonding wire is smaller than electromagnetic coupling between said second power supply bonding wire and said first power supply bonding wire.

8. A design method of an interconnection structure which comprises a semiconductor chip, a mounting substrate on which said semiconductor chip is mounted, and a group of bonding wires provided to connect said semiconductor chip and said mounting substrate, wherein said group of bonding wires comprises:

a first signal bonding wire contained in a first envelope and provided to propagate a signal;

a first power supply bonding wire contained in said first envelope and applied with a first power supply voltage; and a second power supply bonding wire contained in a second envelope and applied with a second power supply voltage, said design method comprising:

setting an initial value of a length of each of said first signal bonding wire, said first power supply bonding wire and said second power supply bonding wire;

generating a circuit model by using electromagnetic field analysis based on the set values;

calculating common mode noise by performing circuit simulation based on said circuit model;

changing the set value for the length of said second power supply bonding wire when the calculated common mode noise is not equal to or less than a threshold value;

repeating said generating, said calculating and said changing until the common mode noise is equal to or less than a threshold value, wherein said setting comprises:

setting a value of a half of the length of said first power supply bonding wire as the initial value of the length of said second power supply bonding wire.

9. The design method according to claim 8, wherein said generating comprises:

generating a model of said semiconductor chip; and
generating a model of said mounting substrate.

* * * * *